United States Patent

Harada

[11] Patent Number: 6,156,125
[45] Date of Patent: Dec. 5, 2000

[54] ADHESION APPARATUS

[75] Inventor: Koji Harada, Kumamoto-ken, Japan

[73] Assignee: Tokyo Electron Limited, Japan

[21] Appl. No.: 09/235,619

[22] Filed: Jan. 21, 1999

[30] Foreign Application Priority Data

Jan. 21, 1998 [JP] Japan .................................. 10-023783

[51] Int. Cl.[7] .................................................. C23C 16/00
[52] U.S. Cl. ............................... 118/733; 118/50; 118/715
[58] Field of Search .................................... 156/381, 382; 118/50, 715, 733; 269/21

[56] References Cited

U.S. PATENT DOCUMENTS

| 5,505,782 | 4/1996 | Stauffer | 118/726 |
| 6,045,617 | 4/2000 | Keller | 118/707 |

FOREIGN PATENT DOCUMENTS 2-238616  9/1990  Japan.

Primary Examiner—Michael W. Ball
Assistant Examiner—John T. Haran
Attorney, Agent, or Firm—Rader, Fishman & Grauer

[57] ABSTRACT

Disclosed is an adhesion apparatus for modifying a surface of a substrate with an adhesion promoter so as to improve the adhesive force of a solution coated on the substrate surface in a photolithography process, comprising a support for holding the substrate, the support having a first contact face, a vacuum suction port formed in the support in a manner to surround the substrate held on the support, a lid having a second contact face which can be brought into contact with the first contact face, a processing space being formed between the table and the lid when the second contact face of the lid is brought contact with the first contact face of the support, unit for supplying an adhesion promoter into the processing space, a first annular sealing member positioned intermediate between the first and second contact faces and outside the vacuum suction port so as to surround the processing space, and a second annular sealing member positioned intermediate between the first and second contact faces and inside the vacuum suction port so as to surround the processing space.

14 Claims, 10 Drawing Sheets

ADHESION APPARATUS

BACKGROUND OF THE INVENTION

The present invention relates to an adhesion apparatus to perform adhesion promoter coat to a substrate such as a semi-conductor wafer.

In a photo-resist treatment process of manufacturing a semi-conductor device in order to promote an adhesive property of a semi-conductor wafer with resist, treatment to give to the wafer is put into practice. In an adhesion apparatus for performing adhesion promoter coat, a treatment vessel is formed with a lower vessel to house wafers and a lid having a shape and size to cover the lower vessel, and supplies vaporized hexamethyl disilazane (expressed "HMDS" hereinafter) to the wafers brought into a processing spece which is built in the inside thereof.

Since the vaporized HMDS supplied into the processing space is controlled to keep a designated temperature and concentration, it is necessary to prevent an outside atmosphere from entering into the processing space. And when the treatment gas generated during the adhesion process leaks to the outside of the processing space, it may cause pollution. Consequently, suitable adhesion promoter coat needs to maintain the inside of the processing space airtight.

Conventionally, in order to keep the processing space airtight, the lid is mechanically pressed by a clamp and the like, so that the lid and the lower vessel are joined together. And between the joint portions of the lid and the lower vessel, a seal member such as an annular O ring and the like is placed to ensure the airtightness in the processing space.

When pressure inside the treatment room is increased, higher pressure is applied on the lid to join the lid and the lower vessel more tightly. When a caliber of a wafer is getting larger, the treatment room accordingly increases in size. Consequently, in such a case, it becomes necessary to apply high pressure on the lid. However, it is unfavorable because a conventional clamping method needs a large clamp, accordingly a wider space.

BRIEF SUMMARY OF THE INVENTION

The present invention is conducted in consideration of the above disadvantage, and the object of the invention is to provide a new treatment apparatus which can firmly join the main frame and the lid without using a clamp or the like and can maintain the inside of the processing space airtight.

According to a first aspect to the present invention, there is provided an adhesion apparatus for modifying a surface of a substrate with an adhesion promoter so as to improve the adhesive force of a solution coated on the substrate surface in a photolithography process, comprising: a support for holding the substrate, the support having a first contact face; a vacuum suction port formed in the support in a manner to surround the substrate held on the support; a lid having a second contact face which can be brought into contact with the first contact face, a processing space being formed between the support and the lid when the second contact face of the lid is brought contact with the first contact face of the support; means for supplying an adhesion promoter into the processing space; a first annular sealing member positioned intermediate between the first and second contact faces and outside the vacuum suction port so as to surround the processing space; and a second annular sealing member positioned intermediate between the first and second contact faces and inside the vacuum suction port so as to surround the processing space.

According to a second aspect of the present invention, there is provided an adhesion apparatus for modifying a surface of a substrate with an adhesion promoter so as to improve the adhesive force of a solution coated on the substrate surface in a photolithography process, comprising: a support for holding the substrate, the support having a first contact face; a lid having a second contact face which can be brought into contact with the first contact face, a processing space being formed between the support and the lid when the second contact face of the lid is brought contact with the first contact face of the support; a vacuum suction port formed in the lid in a manner to surround the substrate held on the support; means for supplying an adhesion promoter into the processing space; a first annular sealing member positioned intermediate between the first and second contact faces and outside the vacuum suction port so as to surround the processing space; and a second annular sealing member positioned intermediate between the first and second contact faces and inside the vacuum suction port so as to surround the processing space.

In the present invention, a space formed between the first seal member and the second seal member can be evacuated in a vacuum so that the main frame and the lid can be firmly joined through the seal member. Accordingly, a clamp becomes needless.

The material of the first annular sealing member can be softer than that of the second annular sealing member and the height of the first annular sealing member can be designed to be higher than that of the second annular sealing member. According to the above described formation, when air is sucked in a vacuum from the vacuum port, and for instance the lid descends down pressed by the external pressure, first the lid contacts the first annular sealing member, then contacts the second annular sealing member. At this time, since the first annular sealing member is softer than the second annular sealing member, the first annular sealing member closely contacts with the main frame so that the processing space can be easily made airtight. And since the second annular sealing member is harder than the first annular sealing member, it is suitable for supporting while putting together. The lid is supported with the second annular sealing member so that the load of the first annular sealing member is reduced, which helps to improve the durability of the first annular sealing member, for example.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
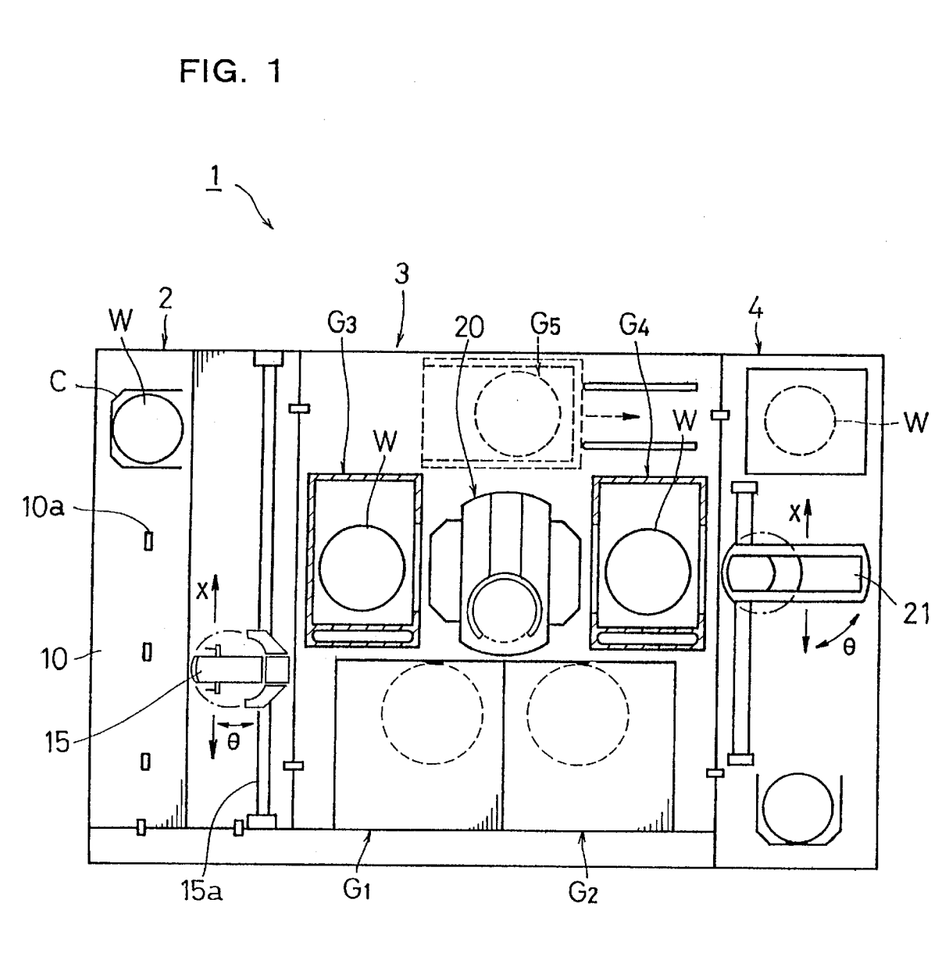
FIG. 1 is an explanatory plane view showing a coating and developing treatment system having an adhesion apparatus relating to the present embodiment.
Figure 2:
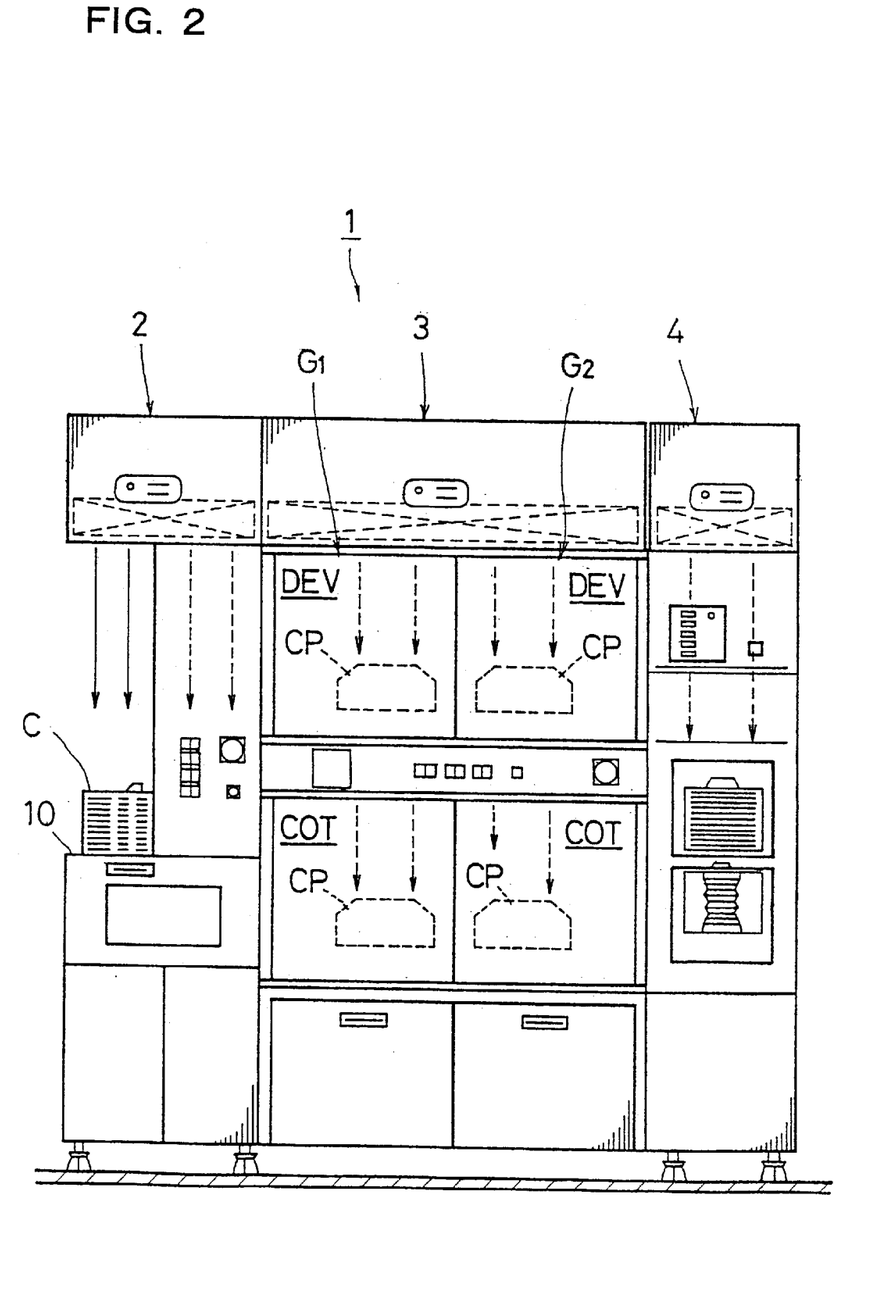
FIG. 2 is an explanatory front view showing the resist coating and developing system in FIG. 1.
Figure 3:
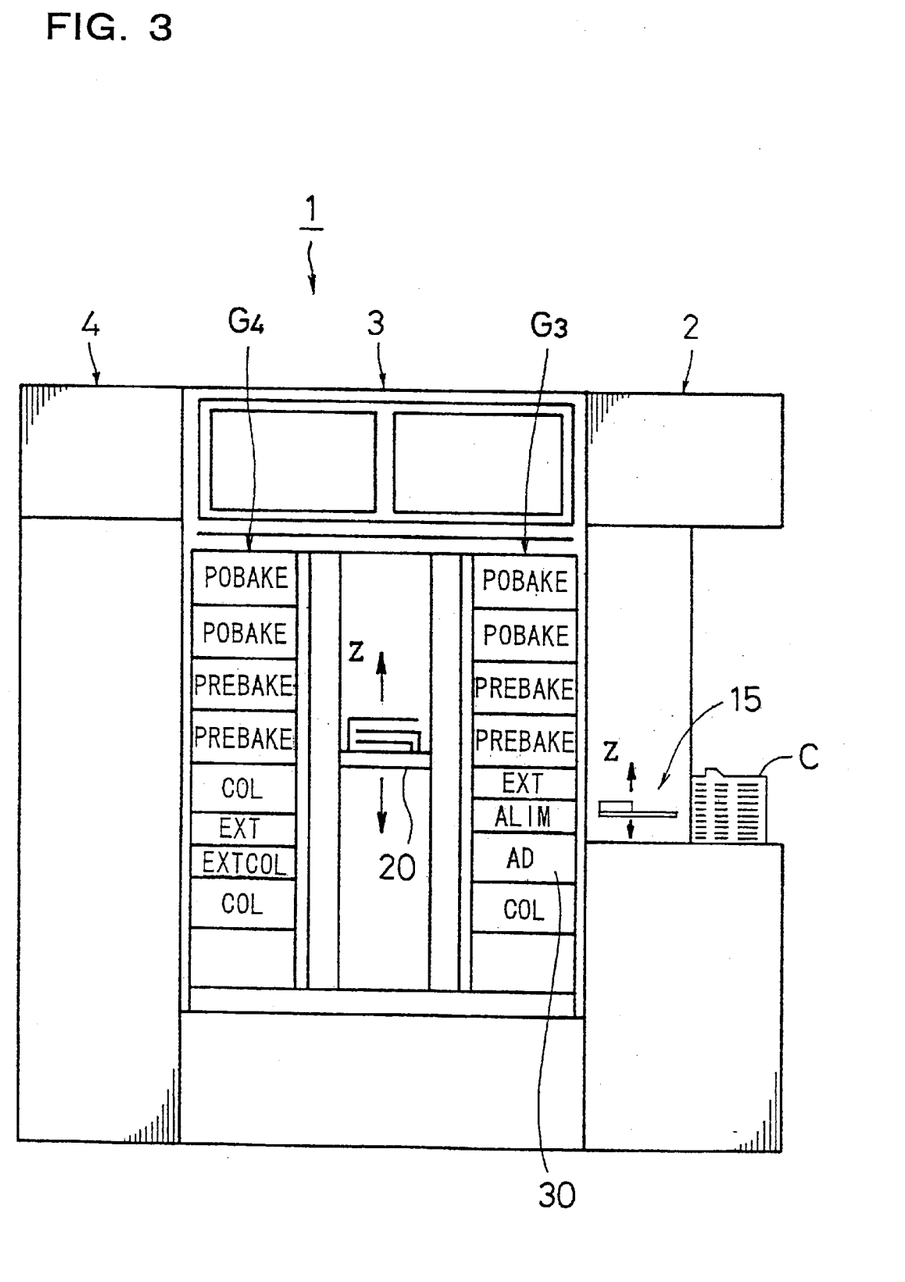
FIG. 3 is an explanatory rear view showing the resist coating and developing system in FIG. 1.

A preferable embodiment of the present invention will be explained below with reference to the attached drawings. The embodiment is applied to an adhesion apparatus installed in a resist coating and developing system which performs a series of photolithography processes to wafers. FIG. 1 to FIG. 3 show an outline of the resist coating and developing system, FIG. 1 is a plane view, FIG. 2 is a front view and FIG. 3 is a rear view respectively.

As shown in FIG. 1, the resist coating and developing system 1 is provided with a cassette station 2 in which, for example, twenty-five wafers W per cassette C are carried in the system from the outside or carried out from the system, and also carried in/out from the cassette C, a process section 3 in which various kinds of processing units are multi-tiered and each processing unit gives the predetermined treatment to wafers W one by one in the process of coating and developing, and an interface unit 4 in which the wafer W is sent and received to/from an optical stepper (not shown) positioned adjacent to the process section 3, all of which are integrally connected.

In the cassette station 2, cassettes C, for example, four cassettes are disposed respectively with each way in/out for wafers opening to the side of the process section 3 in a line in a X-direction (vertical direction in FIG. 1) at the position of each positioning projection 10$a$ on a cassette stand 10 as a mounting unit. A wafer carrier 15 which can move in the direction of disposition of the cassettes C (X-direction) and in the direction of disposition of the wafers W (Z-direction; vertical direction) stored in the cassette C, is movable along a carrier path 15$a$ to selectively approach to each cassette C.

The wafer carrier 15 is rotatable in a θ-direction and accessible to an alignment unit (ALIM) and an extension unit (EXT) which belong to multi-tiered units of a third processing unit group $G_3$ on the side of the process section 3 described later.

In the process section 3, a main carrier unit 20 is placed in a center portion thereof, and various kinds of treatment apparatuses forming a unit are multi-tiered in one unit or over several units around the main carrier unit 20 to form a group of the treatment apparatuses. The resist coating and developing system 1 consists of five groups of the treatment apparatuses $G_1$, $G_2$, $G_3$, $G_4$ and $G_5$ so that they can be arranged in order. The first and the second treatment apparatus groups $G_1$ and $G_2$ are disposed in the front side of the system 1, the third treatment apparatus group $G_3$ is disposed adjacent to the cassette station 2, the fourth treatment apparatus group $G_4$ is disposed adjacent to the interface portion 4, and the fifth treatment apparatus group $G_5$ expressed by a broken line is disposed in the rear side.

In the first treatment apparatus $G_1$, as shown in FIG. 2, two units of spinner type treatment apparatuses to perform predetermined treatment to the wafer W on a spin-chuck in a cup CP, for instance, a resist coating apparatus (COT) and a developing treatment apparatus (DEV) are put in order from the bottom in two tiers. Similar to the first treatment apparatus group $G_1$, in the second treatment apparatus group $G_2$, two units of spinner type treatment apparatuses, for instance, a resist coating apparatus (COT) and a developing treatment apparatus (DEV) are put in order from the bottom in two tiers.

In the third treatment apparatus group $G_3$, as shown in FIG. 3, an oven type treatment apparatus to perform a predetermined treatment to the wafer on the table, for instance, a cooling treatment apparatus (COL) performing cooling treatment, an alignment apparatus (ALIM) performing positioning of the wafer W, an extension apparatus (EXT) to keep the wafer W waiting, a prebaking apparatus (PREBAKE) and a post baking apparatus (POBAKE) to perform heating treatment, and furthermore an adhesion apparatus (AD) 30 to promote an adhesion of the resist and the wafer W and so on are placed on top of one another, for instance, in eight tiers.

These apparatuses can optionally change the combination thereof. By placing the cooling treatment apparatus (COL), the extension apparatus (EXT) and the like which have low treatment temperatures at the lower tiers while the prebaking apparatus (PREBAKE), the post baking apparatus (POBAKE), the adhesion apparatus 30 and the like which have high treatment temperatures at the upper tiers, mutual heat interference among the treatment apparatuses can be reduced.

A wafer carrier 21 is provided in the central portion of the interface portion 4. The wafer carrier 21 is structured to have an ability to freely move along X and Z directions (vertical direction), and freely rotate in θ direction, and approach to the extension unit (EXT) which belongs to the fourth treatment apparatus group $G_4$ in the treatment station 3 side, and the wafer delivery table (not shown) in the optical stepper (not shown) side.

The coating and developing treatment system 1 is structured as above. The structure of the adhesion apparatus 30 relating to the present embodiment installed inside the coating and developing treatment system 1 will be explained next referring to FIG. 4 and FIG. 5. The adhesion apparatus 30 is comprised of a lid 31 as an upper structuring member and a main frame 32 as a lower structuring member. The lid 31 vertically moves by an ascending and descending means (not shown), and the adhesion promoter coat on the wafer W is performed in a processing space 33 formed when the lid 31 and the main frame 32 join together.

Figure 4:
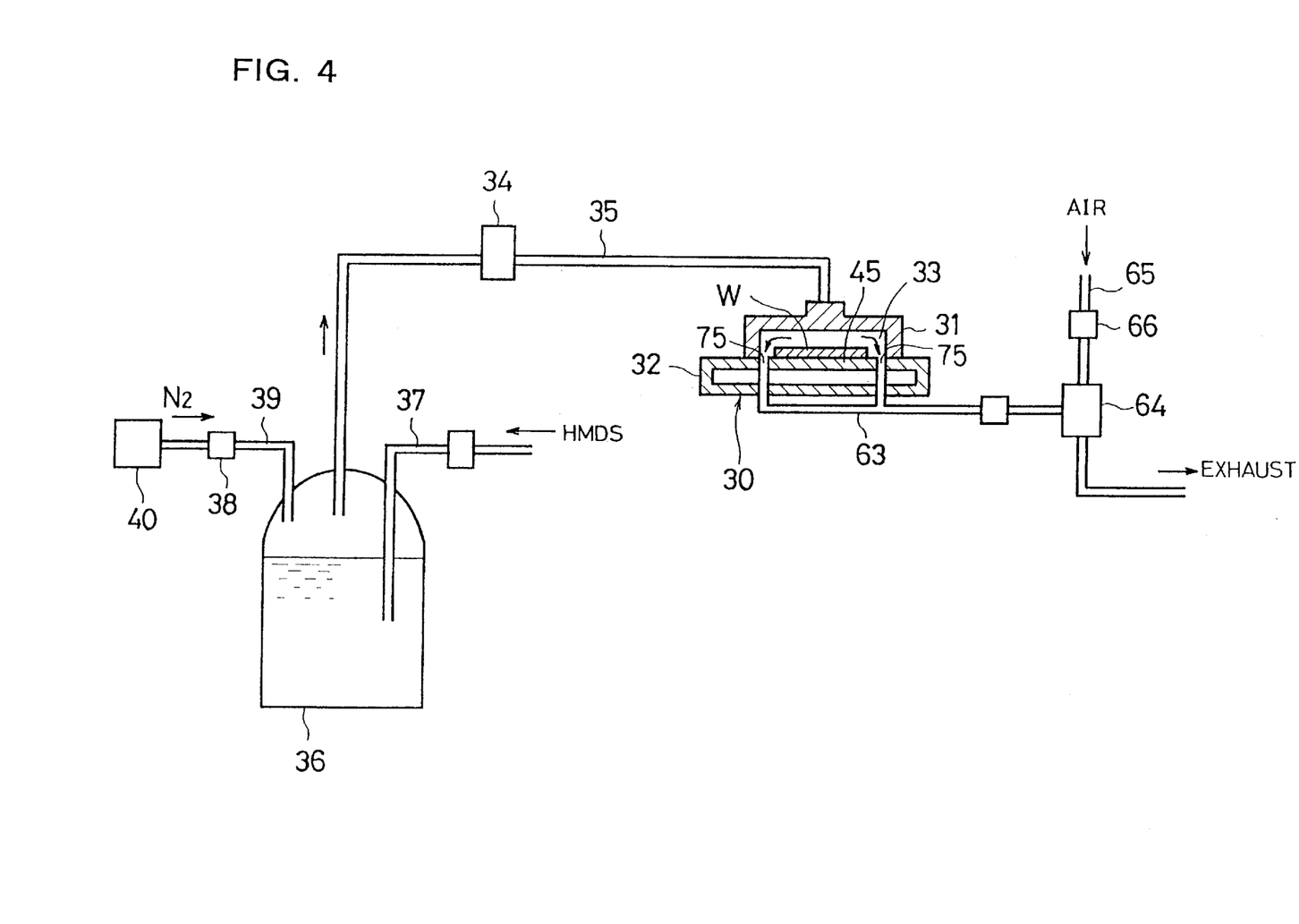
FIG. 4 is a schematic explanatory view showing the configuration of the adhesion apparatus relating to the present embodiment.

As shown in FIG. 4, an end portion of a supply pipe 35 having a switch valve 34 is connected to the upper portion of the lid 31, and the other end of the supply pipe 35 is connected to a tank 36. HMDS solution as a treatment solution is kept in the inside of the tank 36, and a liquid supply pipe 37 to supply HMDS solution from a HMDS solution supply source (not shown) is connected to the tank 36. An end portion of a supply pipe 39 having a valve 38 is connected to the tank 36, and to the other end of the supply pipe 39 a carrier gas supply source 40 to supply carrier gas such as, for instance, nitrogen gas is connected.

Figure 5:
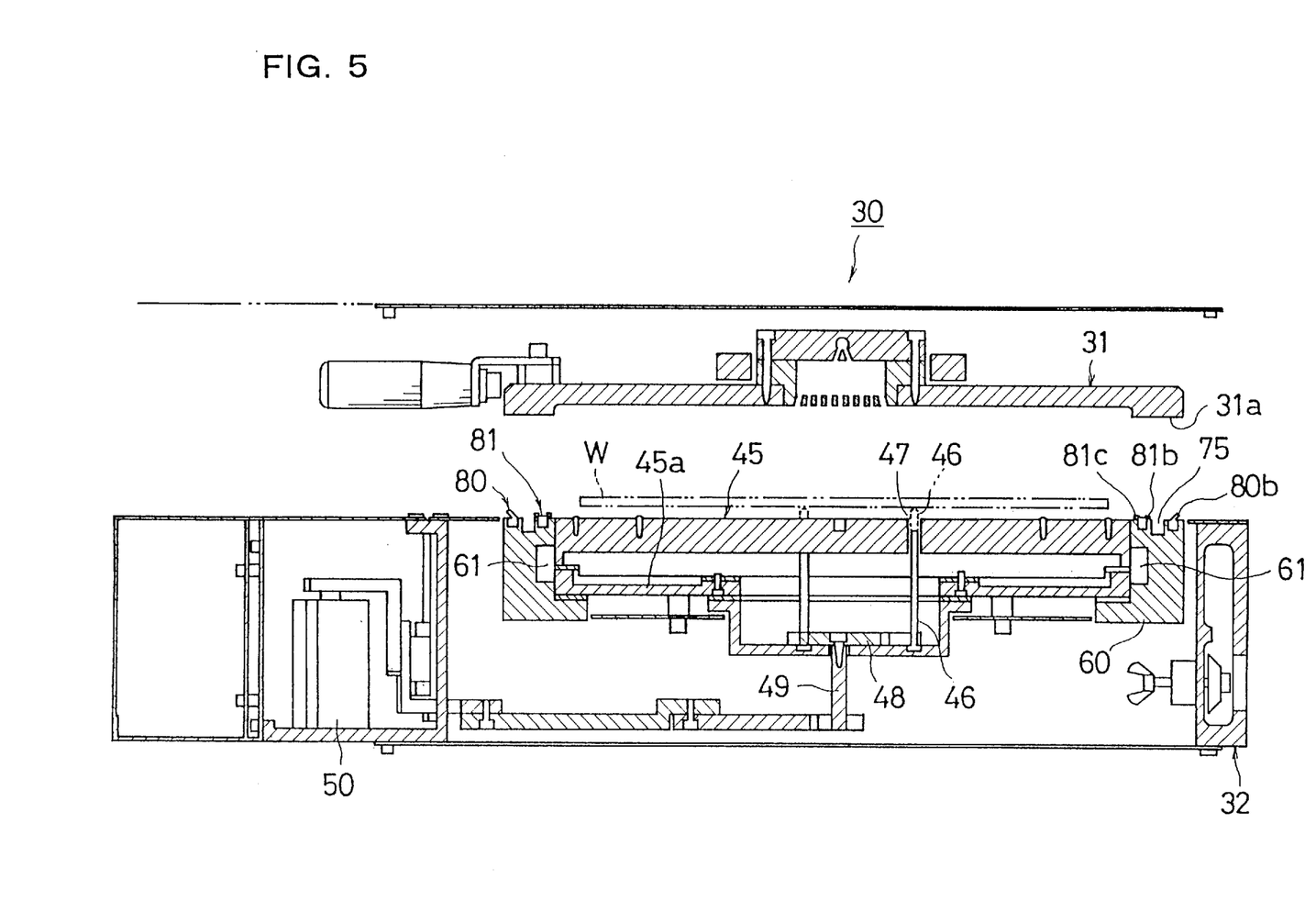
FIG. 5 is an explanatory view showing a whole apparatus before joining a lid and a table of the adhesion apparatus in FIG. 4.

On the other hand, an annular placing table 45 having a heating mechanism (not shown) to heat the wafer W is formed on the upper surface of the main frame 32, as shown in FIG. 5. The placing table 45 is provided with a plurality of bored holes 47 through which a supporting pin 46 to support the wafer W passes. A bracket 48 is connected to the lower portion of the supporting pin 46, and the bracket 48 is connected to an ascending and descending shaft 49. The ascending and descending shaft 49 is vertically movable by a cylinder 50. Accordingly, the supporting pin 46 is structured to be able to freely appear and disappear from and into the upper surface of the placing table 45 by the movement of the cylinder 50. Thus, the wafer W supported by the supporting pin 46 can be freely placed on and off the placing table 45.

Around the placing table 45, an annular support 60 is provided to join the lid 31 and the main frame 32. A hollow portion 61 is arranged in the inside of the support 60, and an end portion of an exhaust pipe 63 shown in FIG. 4 is connected to the hollow portion 61 and the other end portion of the exhaust pipe 63 is connected to an ejector 64 (air pressure type vacuum apparatus). An driving air supply pipe 65 to supply pressure air for driving is connected to the ejector 64, and a valve 66 is provided on the driving air supply pipe 65.

Between the outer circumference of the placing table 45 and the inner circumference of the support 60, a predetermined space of, for instance, 0.3 mm is formed and the space communicates with the hollow portion 61 of the support 60. Consequently, air inside the processing space 33 is exhausted outside from the space provided between the placing table 45 and the support 60 through the hollow portion 61 and the exhaust pipe 63 by driving the ejector 64.

A vacuum port 75 is provided on the center portion of a ring-shape upper end face of the support 60, and the vacuum port 75 is connected through a vacuum pump (not shown) and when the vacuum pump (not shown) is started operating, air is evacuated from the vacuum port 75.

On both sides across the vacuum port 75 of the upper end face of the support 60, an outside sealing member 80 and an inside sealing member 81 such as an 0 ring formed to surround all over the circumference of the wafer W are provided respectively. The outside sealing member 80 and the inside sealing member 81 are concentrically disposed.

Figure 6:
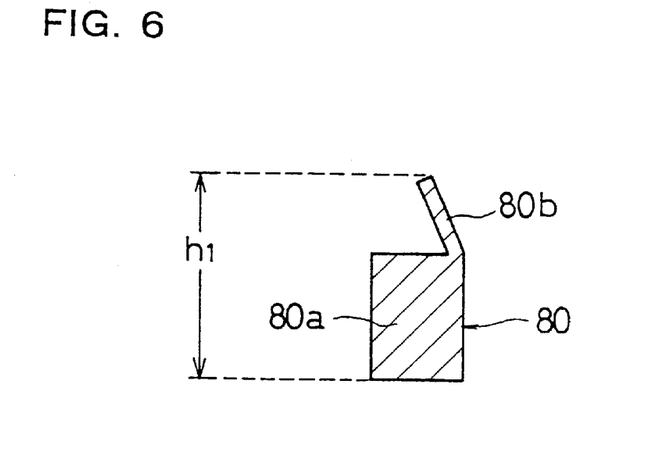
FIG. 6 is an explanatory view showing a structure of an outside annular sealing member.
Figure 7:
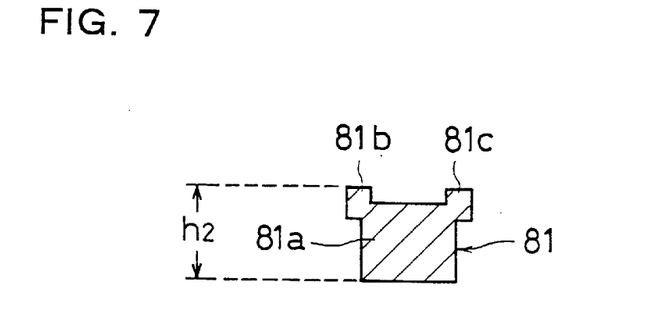
FIG. 7 is an explanatory view showing a structure of an inside annular sealing member.

As shown in FIG. 6, the outside seal member 80 has a ring shaped protrusion 80*b* which is formed to surround all over the circumference of, for instance, the wafer W and has an elevation angle toward outside, on the upper surface of a ring shaped body portion 80*a* having a square shaped cross section. As shown in FIG. 7, on the edges of the outer circumference and the inner circumference of the upper surface of the inside seal member 81, ring shaped protrusions 81*b* and 81*c* which are formed to surround all over the circumference of the wafer W, are provided respectively. The outer seal member 80 is designed to have a higher height $h_1$ than a height $h_2$ of the inside seal member 81. Additionally, a flexible protrusion 80*b* is provided in a slantwise upward direction from the edge of the inside circumference of the upper surface of the body portion 80*a* with an elevation angle.

The adhesion apparatus 30 relating to the embodiment of the present invention is structured as described above. Functions and effects of the adhesion apparatus 30 will be explained next.

The wafer W positioned by the alignment apparatus (ALIM) is transferred while being held by the main carrier unit 20 to the adhesion apparatus 30. At this time, the lid 31 is in a lifted state and the wafer W is placed on the supporting pin 46 of the placing table 45 in the adhesion apparatus 30. Then the lid 31 is allowed to descend from the position in FIG. 8 by the ascending and descending means (not shown). Since the height $h_1$ of the outside seal member 80 is higher than the height $h_2$ of the inside seal member 81, a contact face 31*a* of the lid 31 first touches the flexible protrusion 80*b* of the outside seal member 80 as shown in FIG. 9.

Figure 10:
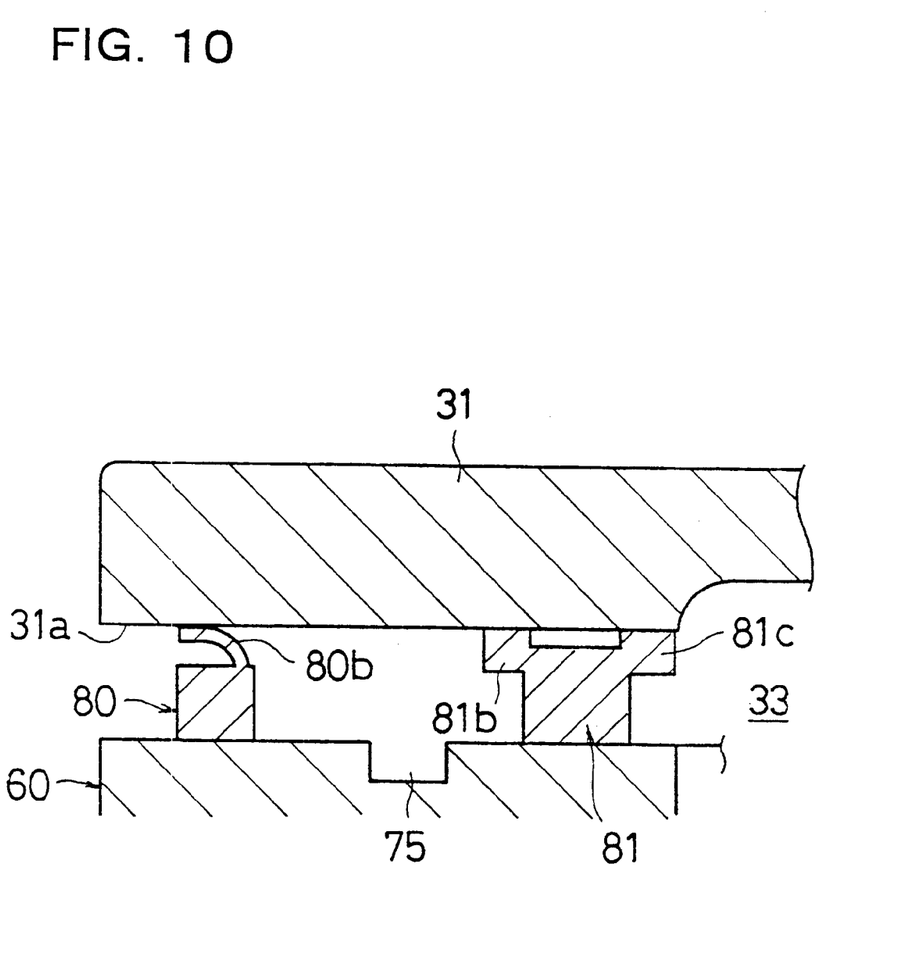
FIG. 10 is a schematic explanatory view of the lid after touching the outside annular sealing member and the inside annular sealing member of the table.

Thus, the vacuum pump (not shown) is started to drive when the contact face 31*a* and the flexible protrusion 80*b* touches each other and air is evacuated from the vacuum port 75. The lid 31 further descends by the evacuation and, as shown in FIG. 10, the contact face 31*a* and the protrusions 81*b*, 81*c* of the inside seal member 81. At this time, a ring shaped closed space is formed surrounded by the contact face 31*a* with the upper face of the support 60, and the outside seal member 80 with the inside seal member 81.

Figure 11:
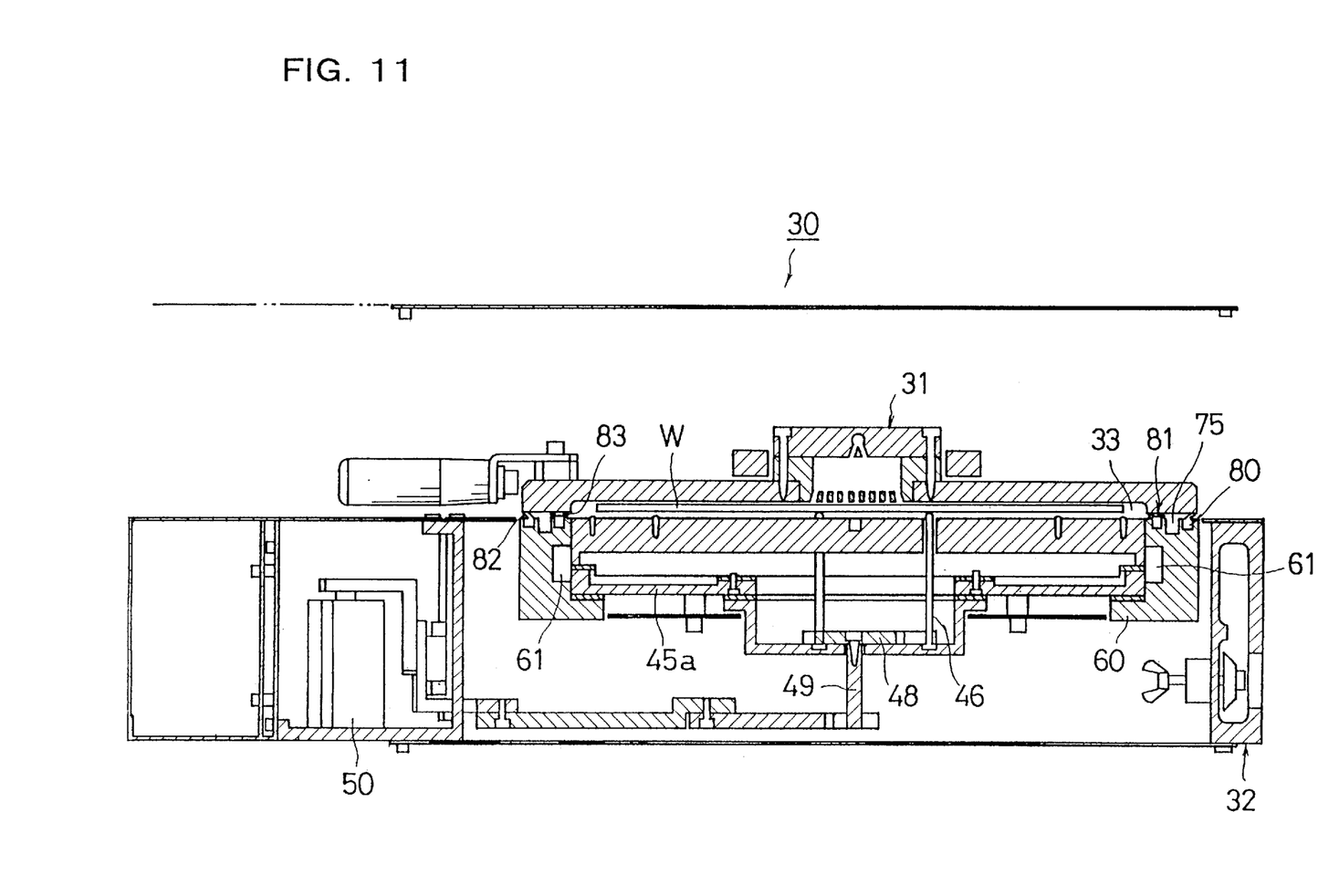
FIG. 11 is a schematic explanatory view of the whole apparatus after joining the lid and the table of the adhesion apparatus in FIG. 4.

By applying negative pressure on the closed space, the lid 31 further descends pushed by the external pressure, and the lid 31 and the main frame 32 are firmly joined through the support 60, as shown in FIG. 11. At this time, since the soft protrusion 80*b* strongly contacts with the contact face 31*a* of the lid 31 all over the entire circumference, the atmosphere in the processing space 33 formed by the joint of the lid 31 and the main frame 32 is kept airtight.

Thus, after the lid 31 and the main frame 32 are firmly put together, a carrier gas is supplied into the tank 36 from the carrier gas supply source 40 through the supply pipe 39, and a vaporized HMDS solution is mixed into the carrier gas. Then, the switch valve 34 is opened and the carrier gas mixed with the vaporized HMDS solution is supplied to the wafer W through the supply pipe 35 and the predetermined hydrophobic treatment is given.

Figure 8:
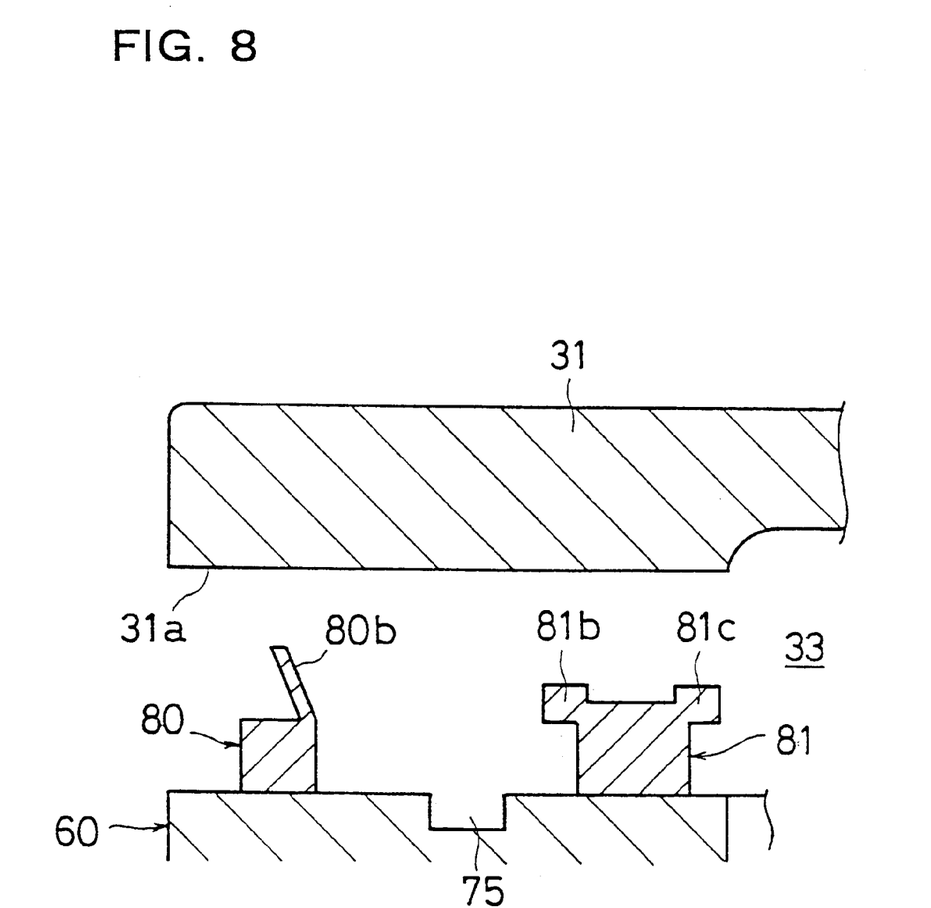
FIG. 8 is a schematic explanatory view of the lid and the table before joining.
Figure 9:
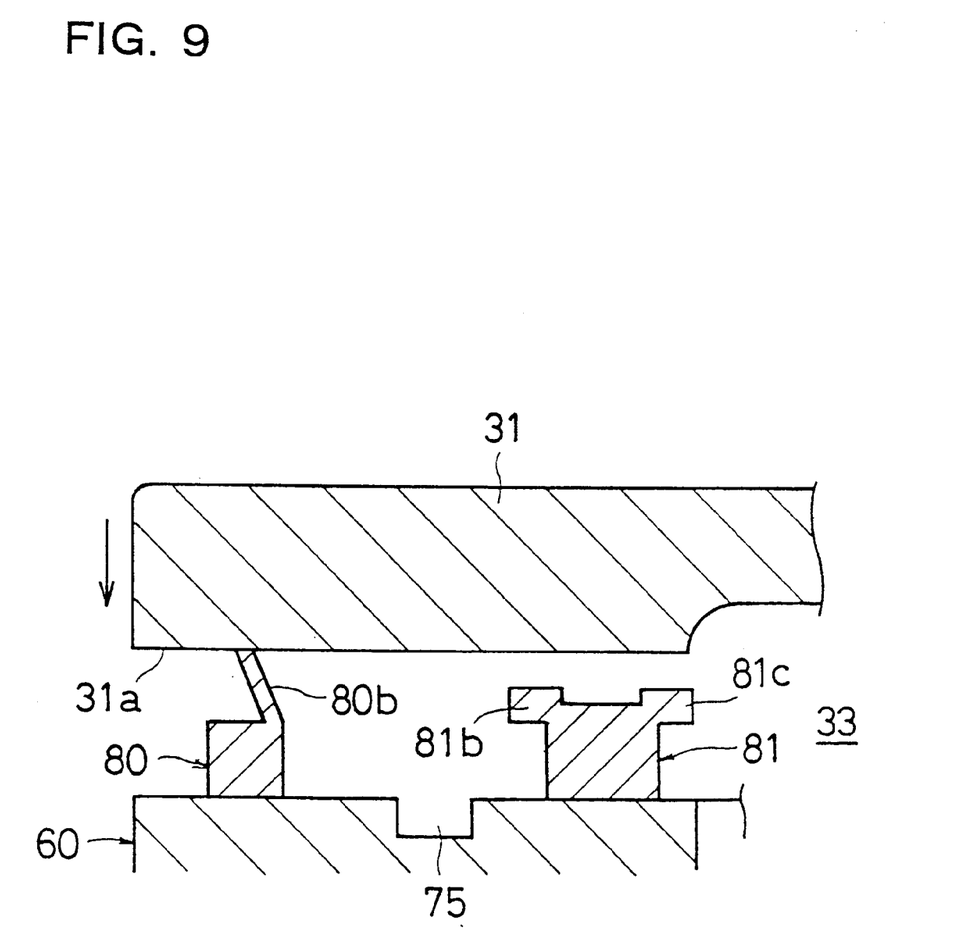
FIG. 9 is a schematic explanatory view of the lid body touching a protrusion of the outside seal member of the base portion.

When the predetermined hydrophobic treatment to the wafer W is finished, the vacuum pump (not shown) is stopped and the lid 31 is ascended to the upper position shown in FIG. 8 by the ascending and descending means (not shown). The wafer W is kept in the main carrier unit 20 and carried to the next cooling treatment apparatus (COL).

In the adhesion apparatus 30 relating to the present embodiment, by evacuating the closed space surrounded by the contact face 31*a* of the lid 31 with the upper surface of the support 60, and the outside seal member 80 with the inside seal member 81, the lid 31 and the main frame 32 can be firmly put together. Accordingly, the conventional clamp is not required any more, down sizing of the hydrophobic treatment apparatus can be realized. And the down sizing of the coating and developing treatment system can be realized.

The height $h_1$ including the protrusion 80*b* of the outside seal member 80 is formed higher than the height $h_2$ including the protrusions 81*b*, 81*c* of the inside seal member 81, and the protrusion 80*b* is formed to be more deformable than the protrusions 81*b* and 81*c*. Accordingly, the protrusion 80*b* is easily deformed with descent of the lid 31 caused by evacuation so that the lid 31 and the main frame 32 can be easily joined.

Additionally, since the flexible protrusion 80*b* of the outside seal member 80 is made of softer material than that of the protrusions 81b, 81c of the inside seal member 81, the lid 31 and the main frame 32 are joined in such a state that the contact face 31a of the lid 31 and the flexible protrusion 80b are firmly jointed. Accordingly, the airtightness inside the processing space 33 can be desirably maintained. When the lid 31 and the main frame 32 are joined, since the contact face 31a is supported by the protrusions 81b and 81c of the inside seal member 81, the load of the flexible protrusion 80b formed with a soft material is reduced. Consequently, the durability of, for instance, the flexivle protrusion 80b is improved.

Figure 12:
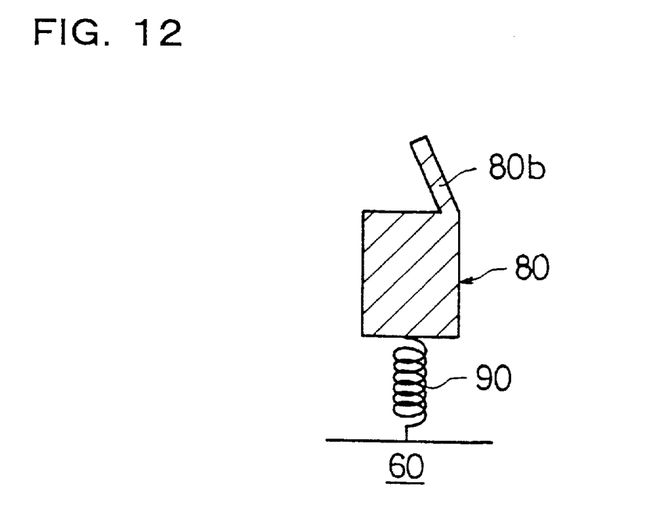
FIG. 12 is an explanatory view showing a modification of the outside annular sealing member in FIG. 6.

In addition, a spring 90 of which one end is connected to the support 60 as shown in FIG. 12, can be provided beneath the outside seal member 80 used for the present embodiment. According to the above described structure, the spring 90 serves as a cushioning member to the flexible protrusion 80b of the outside seal member 80. Therefore, when the lid 31 and the main frame 32 are joined, the flexible protrusion 80b is less damaged and the durability is improved.

In the present embodiment, an example that the lid 31 is made to serve as an upper structuring member and the main frame 32 is made to serve as a lower structuring member, is cited for the explanation of the present invention but the present invention is not limited to such an example. That is, the outside seal member 80 and the inside seal member 81 can be disposed on the lid 31 side as upper structuring members. Or, the outside seal member 80 is disposed on the lid 31 side while the inside seal member 81 is disposed on the main frame 32 side. On the contrary, the disposition of the outside seal member 80 and the inside seal member 81 can be set in reverse order to the above. In addition, the vacuum port 75 can be disposed on the lid 31 side.

Though the example in which the wafer W is used as a substrate is cited to explain the invention, but the present invention is effective even when a LCD substrate is used.

The LCD substrate is usually larger in size than the wafer W, which often requires a larger treatment room than in the case of the wafer W when the adhesion promoter coat is performed to the LCD substrate. Therefore, the present invention which makes it possible to maintain airtightness in the processing space without using a clamp and the like, is also effective in the hydrophobic treatment (adhesion) to the LCD substrate in the same way as in the case of the hydrophobic treatment (adhesion) of the wafer. Furthermore, the present invention is applicable not only to the adhesion apparatus but also to various treatment apparatuses which require airtightness of the processing space.

According to the present invention, the upper component member and the lower component member can be firmly joined while holding each seal member by evacuating from the vacuum port. Therefore, the conventional clamp and the like is not required and a reduction of space by about the same space can be realized.

Especially, by evacuating from the vacuum port, the outside seal member can be easily deformed till it gets the same height as the height of the inside seal member, and the outside seal member and the bottom surface of the upper component are firmly joined. Therefore, airtightness inside the processing space can be improved.

Especially, by providing a protruding portion on the outside seal member, the adherence of the bottom surface of the upper component member and the protruding portion is further improved and maintenance of the airtightness inside the treatment room is further improved.

And by providing a protruding portion on the inside seal member also, the adherence of the bottom surface of the upper component member and the protruding portion is further more improved and the airtightness in the processing space is further more improved.

By evacuating from the vacuum port, since the protruding portion of the outside seal member is easily deformed with descent of the upper component member, the upper component member and the lower component member are easily joined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An adhesion apparatus for modifying a surface of a substrate with an adhesion promoter so as to improve the adhesive force of a solution coated on the substrate surface in a photolithography process, comprising:

a support for holding the substrate, said support having a first contact face;

a vacuum suction port formed in said support in a manner to surround the substrate held on the support;

a lid having a second contact face which can be brought into contact with the first contact face, a processing space being formed between the support and said lid when said second contact face of the lid is brought contact with the first contact face of the support;

means for supplying an adhesion promoter into said processing space;

a first annular sealing member positioned intermediate between the first and second contact faces and outside said vacuum suction port so as to surround said processing space; and a second annular sealing member positioned intermediate between the first and second contact faces and inside the vacuum suction port so as to surround the processing space.

2. The adhesion apparatus according to claim 1, wherein said first sealing member is formed on at least one of said first and second contact faces, and said second sealing member is formed on at least the other of the first and second contact faces.

3. The adhesion apparatus according to claim 1, wherein said first sealing member is formed of a material softer than a material of said second sealing member, the tip portion of the first sealing member is positioned higher than the tip portion of the second sealing member, and the tip portion of the first sealing member is deformed when the lid is brought into contact with the support.

4. The adhesion apparatus according to claim 1, wherein said first sealing member includes a tongue-shaped flexible tip portion, and said second sealing member includes a pair of inflexible tip portions, said flexible tip portion projecting higher than said inflexible portions.

5. The adhesion apparatus according to claim 4, wherein a material of said tongue-shaped tip portion is softer than a material of said inflexible tip portion.

6. The adhesion apparatus according to claim 4, wherein said tongue-shaped flexible tip portion is inclined outward.

7. The adhesion apparatus according to claim 4, wherein said pair of inflexible tip portions have the same height and flat upper surfaces.

8. An adhesion apparatus for modifying a surface of a substrate with an adhesion promoter so as to improve the adhesive force of a solution coated on the substrate surface in a photolithography process, comprising:

a support for holding the substrate, said support having a first contact face;

a lid having a second contact face which can be brought into contact with the first contact face, a processing space being formed between the support and said lid when said second contact face of the lid is brought contact with the first contact face of the support;

a vacuum suction port formed in said lid in a manner to surround the substrate held on the support;

means for supplying an adhesion promoter into said processing space;

a first annular sealing member positioned intermediate between the first and second contact faces and outside said vacuum suction port so as to surround said processing space; and a second annular sealing member positioned intermediate between the first and second contact faces and inside the vacuum suction port so as to surround the processing space.

9. The adhesion apparatus according to claim 8, wherein said first sealing member is formed on at least one of said first and second contact faces, and said second sealing member is formed on at least the other of the first and second contact faces.

10. The adhesion apparatus according to claim 8, wherein said first sealing member is formed of a material softer than a material of said second sealing member, the tip portion of the first sealing member is positioned higher than the tip portion of the second sealing member, and the tip portion of the first sealing member is deformed when the lid is brought into contact with the support.

11. The adhesion apparatus according to claim 8, wherein said first sealing member includes a tongue-shaped flexible tip portion, and said second sealing member includes a pair of inflexible tip portions, said flexible tip portion projecting higher than said inflexible portions.

12. The adhesion apparatus according to claim 11, wherein a material of said tongue-shaped tip portion is softer than a material of said inflexible tip portion.

13. The adhesion apparatus according to claim 11, wherein said tongue-shaped flexible tip portion is inclined outward.

14. The adhesion apparatus according to claim 11, wherein said pair of inflexible tip portions have the same height and flat upper surfaces.

* * * * *